US 7,098,665 B2

(12) United States Patent
Laig-Hoerstebrock

(10) Patent No.: US 7,098,665 B2
(45) Date of Patent: Aug. 29, 2006

(54) METHOD FOR PREDICTION OF THE INTERNAL RESISTANCE OF AN ENERGY STORAGE BATTERY, AND A MONITORING DEVICE FOR ENERGY STORAGE BATTERIES

(75) Inventor: Helmut Laig-Hoerstebrock, Frankfurt (DE)

(73) Assignee: VB Autobatterie GmbH, Hannover (DE)

( * ) Notice: Subject to any disclaimer, the term of this patent is extended or adjusted under 35 U.S.C. 154(b) by 285 days.

(21) Appl. No.: 10/705,033

(22) Filed: Nov. 10, 2003

(65) Prior Publication Data

US 2004/0150406 A1 Aug. 5, 2004

(30) Foreign Application Priority Data

Nov. 13, 2002 (DE) ............................... 102 52 760

(51) Int. Cl.
*G01N 27/416* (2006.01)
(52) U.S. Cl. ...................................................... 324/430
(58) Field of Classification Search ................ 324/430, 324/426; 320/132; 702/63
See application file for complete search history.

(56) References Cited

U.S. PATENT DOCUMENTS

| 3,906,329 A | 9/1975 | Bader |
| 4,153,867 A | 5/1979 | Jungfer et al. |
| 4,193,025 A | 3/1980 | Frailing et al. |
| 4,207,611 A | 6/1980 | Gordon |
| 4,322,685 A | 3/1982 | Frailing et al. |
| 4,595,880 A | 6/1986 | Patil |
| 4,642,600 A | 2/1987 | Gummelt et al. |
| 4,659,977 A | 4/1987 | Kissel et al. |
| 4,665,370 A | 5/1987 | Holland |
| 4,719,427 A | 1/1988 | Morishita et al. |
| 4,816,736 A | 3/1989 | Dougherty et al. |
| 4,876,513 A | 10/1989 | Brilmyer et al. |
| 4,888,716 A | 12/1989 | Ueno |
| 4,937,528 A | 6/1990 | Palanisamy |
| 4,943,777 A | 7/1990 | Nakamura et al. |

(Continued)

FOREIGN PATENT DOCUMENTS

DE 22 42 410 3/1973

(Continued)

OTHER PUBLICATIONS

Intelec ' 88—Tenth International communications Energy Conference, "A look at the Impedance of a Cell—S.L. DeBardelaben, New York Telephone Company," bearing a designation "Oct. 30-Nov. 2, 1988." (6 sheets).

(Continued)

*Primary Examiner*—Pia Tibbits
(74) *Attorney, Agent, or Firm*—Foley & Lardner LLP

(57) ABSTRACT

A method for predicting the internal resistance of an energy storage battery in assumed environmental and battery state conditions includes subdividing the internal resistance into a first resistance component which represents the electrical resistance of the energy storage battery for the region of electron conduction and a second resistance component which represents the electrical resistance of the energy storage battery for the region of ion conduction. The method also includes determining the first and second resistance components to be expected for the assumed environmental and battery state conditions. Each of the first and second resistance components are determined as a function of parameters of the assumed environmental and battery state conditions. Monitoring devices or computer programs may be utilized to carry out the method.

21 Claims, 2 Drawing Sheets

U.S. PATENT DOCUMENTS

| | | |
|---|---|---|
| 4,952,861 A | 8/1990 | Horn |
| 5,002,840 A | 3/1991 | Klebenow et al. |
| 5,032,825 A | 7/1991 | Kuznicki |
| 5,055,656 A | 10/1991 | Farah et al. |
| 5,079,716 A | 1/1992 | Lenhardt et al. |
| 5,130,699 A | 7/1992 | Reher et al. |
| 5,159,272 A | 10/1992 | Rao et al. |
| 5,162,164 A | 11/1992 | Dougherty et al. |
| 5,204,610 A | 4/1993 | Pierson et al. |
| 5,223,351 A | 6/1993 | Wruck |
| 5,280,231 A | 1/1994 | Kato et al. |
| 5,281,919 A | 1/1994 | Palanisamy |
| 5,316,868 A | 5/1994 | Dougherty et al. |
| 5,321,627 A | 6/1994 | Reher |
| 5,352,968 A | 10/1994 | Reni et al. |
| 5,381,096 A | 1/1995 | Hirzel |
| 5,404,129 A | 4/1995 | Novak et al. |
| 5,412,323 A | 5/1995 | Kato et al. |
| 5,416,402 A | 5/1995 | Reher et al. |
| 5,421,009 A * | 5/1995 | Platt .......................... 709/221 |
| 5,428,560 A | 6/1995 | Leon et al. |
| 5,439,577 A | 8/1995 | Weres et al. |
| 5,488,283 A | 1/1996 | Dougherty et al. |
| 5,549,984 A | 8/1996 | Dougherty |
| 5,552,642 A | 9/1996 | Dougherty et al. |
| 5,563,496 A | 10/1996 | McClure |
| 5,572,136 A | 11/1996 | Champlin |
| 5,578,915 A | 11/1996 | Crouch, Jr. et al. |
| 5,656,915 A | 8/1997 | Eaves |
| 5,680,050 A | 10/1997 | Kawai et al. |
| 5,698,965 A | 12/1997 | York |
| 5,721,688 A | 2/1998 | Bramwell |
| 5,744,936 A | 4/1998 | Kawakami |
| 5,744,963 A | 4/1998 | Arai et al. |
| 5,761,072 A | 6/1998 | Bardsley, Jr. et al. |
| 5,773,977 A | 6/1998 | Dougherty |
| 5,808,367 A | 9/1998 | Akagi et al. |
| 5,808,445 A | 9/1998 | Aylor et al. |
| 5,818,116 A | 10/1998 | Nakae et al. |
| 5,818,333 A | 10/1998 | Yaffe et al. |
| 5,896,023 A | 4/1999 | Richter |
| 5,898,292 A | 4/1999 | Takemoto et al. |
| 5,936,383 A | 8/1999 | Ng et al. |
| 5,965,954 A | 10/1999 | Johnson et al. |
| 5,977,654 A | 11/1999 | Johnson et al. |
| 5,990,660 A | 11/1999 | Meissner |
| 6,016,047 A | 1/2000 | Notten et al. |
| 6,037,749 A | 3/2000 | Parsonage |
| 6,037,777 A | 3/2000 | Champlin |
| 6,057,666 A | 5/2000 | Dougherty et al. |
| 6,087,808 A | 7/2000 | Pritchard |
| 6,091,325 A | 7/2000 | Zur et al. |
| 6,118,252 A | 9/2000 | Richter |
| 6,118,275 A | 9/2000 | Yoon et al. |
| 6,144,185 A | 11/2000 | Dougherty et al. |
| 6,160,382 A | 12/2000 | Yoon et al. |
| 6,163,133 A * | 12/2000 | Laig-Horstebrock et al. .......................... 320/132 |
| 6,167,349 A * | 12/2000 | Alvarez ....................... 702/63 |
| 6,222,341 B1 | 4/2001 | Dougherty et al. |
| 6,268,712 B1 | 7/2001 | Laig-Horstebrock et al. |
| 6,271,642 B1 | 8/2001 | Dougherty et al. |
| 6,296,593 B1 | 10/2001 | Gotou et al. |
| 6,300,763 B1 | 10/2001 | Kwok |
| 6,304,059 B1 | 10/2001 | Chalasani et al. |
| 6,331,762 B1 | 12/2001 | Bertness |
| 6,369,578 B1 | 4/2002 | Crouch, Jr. et al. |
| 6,388,421 B1 | 5/2002 | Abe |
| 6,388,450 B1 | 5/2002 | Richter et al. |
| 6,392,389 B1 | 5/2002 | Kohler |
| 6,392,414 B1 | 5/2002 | Bertness |
| 6,392,415 B1 | 5/2002 | Laig-Horstebrock et al. |
| 6,417,668 B1 | 7/2002 | Howard et al. |
| 6,424,157 B1 | 7/2002 | Gollomp et al. |
| 6,441,585 B1 | 8/2002 | Bertness |
| 6,445,158 B1 | 9/2002 | Bertness et al. |
| 6,452,361 B1 | 9/2002 | Dougherty et al. |
| 6,472,875 B1 | 10/2002 | Meyer |
| 6,495,990 B1 | 12/2002 | Champlin |
| 6,507,194 B1 | 1/2003 | Suzuki |
| 6,515,452 B1 | 2/2003 | Choo |
| 6,515,456 B1 | 2/2003 | Mixon |
| 6,522,148 B1 | 2/2003 | Ochiai et al. |
| 6,534,992 B1 | 3/2003 | Meissner et al. |
| 6,556,019 B1 | 4/2003 | Bertness |
| 6,600,237 B1 | 7/2003 | Meissner |
| 6,600,293 B1 | 7/2003 | Kikuchi |
| 6,608,482 B1 | 8/2003 | Sakai et al. |
| 6,653,818 B1 | 11/2003 | Laig-Horstebrock et al. |
| 2002/0008495 A1 | 1/2002 | Dougherty et al. |
| 2002/0026252 A1 | 2/2002 | Wruck et al. |
| 2002/0031700 A1 | 3/2002 | Wruck et al. |
| 2003/0047366 A1 | 3/2003 | Andrew et al. |
| 2003/0082440 A1 | 5/2003 | Mrotek et al. |
| 2003/0142228 A1 | 7/2003 | Flach et al. |
| 2003/0236656 A1 | 12/2003 | Dougherty |
| 2004/0021468 A1 | 2/2004 | Dougherty et al. |
| 2004/0212367 A1 * | 10/2004 | Dougherty .................. 324/426 |

FOREIGN PATENT DOCUMENTS

| | | |
|---|---|---|
| DE | 2 242 510 C3 | 4/1974 |
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 69900638 T | 3/2002 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Battery Alert, Ltd., "The Easy-to-Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Battery Evaluation Reports, s.e. Ross Laboratories, Inc., Apr. 1999 (1 page).

HSR-003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Reed Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pp. http://www.cotorelay.com/ReedTech.pdf, available at least by Jan. 6, 2003, 37-43.

Willibert Schleuter, *Das elektrische Ersatzschaltbild des Bleiakkumulators unter Berücksichtigung erzwungener Elektrolytströmung*, etz Archiv, vol. 4 (1982), Issue 7, pp. 213-218.

Lürkens et al., *Ladezustandsschätzuntt von Bleibatterien mit Hilfe des Kalman-Filters*, etz Archiv, vol. 8 (1986), Issue 7, pp. 231-236.

Brooke, L., "Resin Keeps Batteries Cool", A1 Inside Magazine, Nov. 1998, p. 55.

Hoover, J., "Failure Modes of Batteries Removed from Service", A Presentation at the 107th Convention of Battery Council International, Apr. 30-May 3, 1995, p. 62.

Stan Gibilisco and Neil Sclater, Co-Editors-in-Chief, "Rectifier Bridge," Encyclopedia of Electronics, 2nd Edition, TAB Professional and Reference Books, 1996, pp. 708-711.

Lehman, A., "Electrical Battery Model For Leo Application Based on Absolute Instantaneous State of Charge," Proceedings of the European Space Power Conference held in Madrid, Spain, Oct. 2-6, 1989, ESA Publications, NL, vol. 1, pp. 173-178.

Robbins, Tim & Hawkins, John, "Battery Model For Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Mayer, D. et al., "Modelling and Analysis of Lead Acid Battery Operation," Ecole des Mines de Paris, XP010092137, pp. 1-3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Baert, D & Vervaet, A., "Lead-Acid Battery Model for the Derivation of Peukert's Law," Electrochimica Acta, Elsevier Science Publishers, Barking, GB, vol. 44, No. 20, pp. 3491-3504 XP004168624 ISSN: 0013-4686.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19-22, 1986." (6 sheets).

Bosch and the New E-Class, Electronic Battery Management System, Focus on Electronics, Nov. 2002 (1 sheet).

Forecast Review, The Battery Man, Nov. 1996 p. 21.

OnGuard™ XT Battery State-of-Health Monitor, 2003 Midtronics, Inc. P/N 156-983A (2 sheets).

* cited by examiner

METHOD FOR PREDICTION OF THE INTERNAL RESISTANCE OF AN ENERGY STORAGE BATTERY, AND A MONITORING DEVICE FOR ENERGY STORAGE BATTERIES

CROSS-REFERENCE TO RELATED PATENT APPLICATIONS

Germany Priority Application DE 102 52 760.1, filed Nov. 13, 2002, including the specification, drawings, claims and abstract, is incorporated herein by reference in its entirety.

BACKGROUND OF THE INVENTION

The present invention relates to a method for prediction of the internal resistance of an energy storage battery in assumed environmental and battery state conditions. The present invention also relates to a monitoring device for energy storage batteries having measurement means for measurement of parameters for the environmental and battery state conditions for the energy storage battery and also having computation means. The present invention also relates to a product in the form of a computer program with program code means for carrying out the method mentioned above.

During operation of energy storage batteries, in particular starter batteries in motor vehicles, there is a need to determine the instantaneous state of the energy storage battery and to predict a future state in assumed environmental and battery state conditions. For example, it is desirable to determine the starting capability of a starter battery for starting an internal combustion engine in assumed temperature conditions. It is known for the instantaneous internal resistance to be determined for this purpose. This may be done, for example, from the drop in voltage on starting as the quotient of the voltage change divided by the current change. The internal resistance may also be obtained by matching the voltage and current information for the energy storage battery to a relatively complex equivalent circuit. An internal resistance determined in this way may then be used as a prognosis for a future starting process.

DE 198 47 648 A1 discloses a method for determination of the state of charge and of the high-current load capacity of batteries, in which the internal resistance of the battery is determined by means of a voltage and current measurement on high load, for example, during the starting process. Furthermore, the state of charge SOC of the energy storage battery is determined in a first state. This is done, for example, by measurement of the no-load voltage. The internal resistance is subdivided into a part which is only temperature-dependent and is virtually independent of the state of charge, and into a component which varies to a major extent with the state of charge for states of charge below 50%. A no-load voltage for a subsequent time is predicted from the internal resistance that has been subdivided in this way for a predetermined temperature and from the most recently determined state of charge, from which no-load voltage it is possible to use the known current required for starting an internal combustion engine to derive a statement about the capability of the energy storage battery for starting.

It would be advantageous to provide an improved method for predicting the internal resistance of an energy storage battery in assumed environmental and battery state conditions, by means of which, for example, the starting capability of a starter battery for a motor vehicle for a subsequent time can be predicted. It would be also advantageous to provide a monitoring device for energy storage batteries having measurement means for measurement of parameters for the environmental and operating state conditions for the energy storage battery, and having computation means which are designed to carry out the method described above. It would be also advantageous to provide a product in the form of an embodied computer program with program code means which are designed to carry out the method described above when the computer program is run using a processor device.

It would be advantageous to provide a system and/or method that includes any one or more of these or other advantageous features.

SUMMARY

An exemplary embodiment relates to a method for predicting the internal resistance of an energy storage battery in assumed environmental and battery state conditions. The method includes subdividing the internal resistance into a first resistance component which represents the electrical resistance of the energy storage battery for the region of electron conduction and a second resistance component which represents the electrical resistance of the energy storage battery for the region of ion conduction. The method also includes determining the first and second resistance components to be expected for the assumed environmental and battery state conditions. Each of the first and second resistance components are determined as a function of parameters of the assumed environmental and battery state conditions.

Another exemplary embodiment relates to a monitoring device for an energy storage battery. The monitoring device includes a measurement device for measuring parameters for the environmental and operating state conditions of the energy storage battery. The monitoring device also includes a computation device configured to carry out a method that includes subdividing the internal resistance of the energy storage battery into a first resistance component which represents the electrical resistance of the energy storage battery for the region of electron conduction and a second resistance component which represents the electrical resistance of the energy storage battery for the region of ion conduction. The method also includes determining the first and second resistance components to be expected for assumed environmental and battery state conditions. Each of the first and second resistance components are determined as a function of parameters of the assumed environmental and battery state conditions.

Another exemplary embodiment relates to a computer program that includes computer program code that when run using a processor device is configured to carry out a method that includes subdividing the internal resistance of an energy storage battery into a first resistance component which represents the electrical resistance of the energy storage battery for the region of electron conduction and a second resistance component which represents the electrical resistance of the energy storage battery for the region of ion conduction. The method also includes determining the first and second resistance components to be expected for assumed environmental and battery state conditions. Each of the first and second resistance components are determined as a function of parameters of the assumed environmental and battery state conditions.

BRIEF DESCRIPTION OF THE DRAWINGS

The invention will be explained in more detail in the following text with reference to the attached drawings, in which.

DETAILED DESCRIPTION OF THE PREFERRED AND EXEMPLARY EMBODIMENTS

Figure 1:
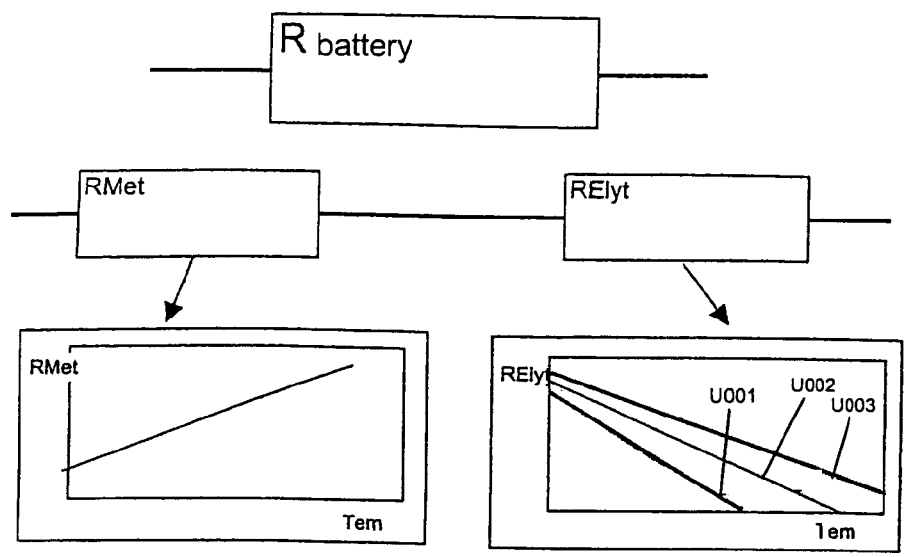
FIG. 1 shows a block diagram illustrating the subdivision of the internal resistance into a first resistance component and a second resistance component, with associated functions.

According to an exemplary embodiment, a method is provided for predicting the internal resistance of a battery (e.g., an energy storage battery such as a lead-acid battery for use in vehicle starting, lighting, and ignition applications) in assumed environmental and battery state conditions, by means of which, for example, the starting capability of a starter battery for a motor vehicle for a subsequent time can be predicted, at which the temperature and/or the state of charge of the energy storage battery has changed considerably, for example, due to residual current loads.

According to an exemplary embodiment, the method includes subdividing the internal resistance at least into a first resistance component (which represents the electrical resistance of the energy storage battery for the region of electron conduction) and a second resistance component (which represents the electrical resistance of the energy storage battery for the region of ion conduction). The method also includes determining the resistance components to be expected for the assumed environmental and battery state conditions, in each case as a function of parameters of the assumed environmental and battery state conditions.

It has been found that the relationships between the internal resistance and the state of charge and temperature as parameters for the environmental and battery state conditions for metallic output conductors (i.e., for the region of electron conduction) are very different from the internal resistance for electrolytes (i.e., for the region of ion conduction). In this case, relatively simple functional relationships with the parameters for the environmental and battery state conditions in each case exist for the first resistance component for the metallic output conductors and for the second resistance component for the electrolytes. Separating the internal resistance into the first resistance component and second resistance component resolves the complex relationship between the internal resistance and the environmental and battery state conditions, breaking it down into relatively simple functional relationships.

The resistance components are advantageously calculated from a factor multiplied by a battery-independent function. The first factor for the first resistance component and the second factor for the second resistance component are in this case defined or determined as a function of the type of energy storage battery. The first resistance component is then determined from the first factor and from a battery-independent first function of parameters for the environmental conditions for the energy storage battery, and the second resistance component is determined from the second factor and from a battery-independent second function for environmental and battery state conditions for the energy storage battery. As a result, only the first and second factors for the energy storage battery need be defined or learned. In contrast, the first and second functions are independent of the battery type and can thus be determined and defined on a general basis. It is thus possible to predict the internal resistance for unknown energy storage batteries once the first and second factors have been learned as a function of the battery type.

The first and second factors are preferably determined by determination of parameters and internal resistances for at least two environmental and/or battery state conditions which differ from one another. After estimation of one of the factors and determination of the parameters for two environmental and/or battery state conditions which differ from one another, in particular for two different temperatures, the system may calculate the first factor and the second factor with a sufficient degree of accuracy.

A variable which is proportional to the battery temperature is preferably used as a parameter for determination of the first resistance component. A variable which is proportional to the battery temperature and a variable which is proportional to the state of charge of the energy storage battery are preferably used as parameters for determination of the second resistance component. The battery or environmental temperature may be measured, for example, as a temperature parameter, that is to say as a variable which is proportional to the battery temperature. The variable which is proportional to the state of charge of the energy storage battery is preferably the no-load voltage of the energy storage battery. The internal resistance of the energy storage battery is also determined as a parameter, in a known manner.

The first and second factors are preferably determined iteratively by means of the following steps:

a) estimation of the first factor;

b) determination of the second factor as a function of the estimated first factor and of parameters which have been determined for first environmental and battery state conditions;

c) determination of a corrected first factor for changed second environmental and/or battery state conditions as a function of the previously determined second factor and of the parameters determined for the second environmental and battery state conditions; and d) determination of the second factor as a function of the corrected first factor and of the parameters determined for the first or second environmental and battery state conditions.

In this case, steps c) and d) may be repeated as often as desired in order to improve the accuracy of the first and second factors.

The first and second factors determined in this way are used to determine the first resistance component using the formula $$R_{Met} = Rfact_{Met}(T_0) \cdot r(T)$$

where $RFact_{Met}(T_0)$ is the first factor for a reference temperature ($T_0$) and $r(T)$ is a first function which is dependent on the battery temperature T. The first function $r(T)$ may, for example, be defined as an equation $$r(T)=1+k\cdot(T-T_0)+l(T-T_0)^2$$

with the constants k and l. According to an exemplary embodiment, the constant k is equal to 0.00334 and the constant l may be equal to zero for a lead-acid rechargeable battery with six cells.

The second resistance component is determined, for example, using the formula $$R_{Elyt}=1/(Lfact\cdot f(T,SOC))$$

where Lfact is the second factor and f(T, SOC) is a second function which is dependent on the battery temperature T and on the state of charge parameter SOC for the energy storage battery.

The second function f(T, SOC) may, for example, be defined as an equation $$f(T,SOC)=(a+b\cdot SOC+c\cdot SOC^2)\cdot(1+d(T-T_0)+e(T-T_0)^2)$$

with the constants a, b, c, d and e and the reference temperature $T_0$. For a lead-acid battery with six cells, the constant a is preferably approximately 0.451, the constant b is preferably approximately 1.032, the constant c is preferably approximately −0.697, the constant d is preferably approximately 0.0137 and the constant e is preferably approximately 0. The reference temperature is preferably defined to be 25° C.

In order to make it possible to take account, for example, of uncertainties resulting from measurement inaccuracies and scatter associated with these inaccuracies, the first factor is preferably corrected by determination of an instantaneous first factor for instantaneous environmental and battery state conditions and calculation of the corrected first factor from the instantaneous first factor and from at least one weighted previously determined first factor. The second factor can also be corrected in a corresponding manner by determination of an instantaneous second factor for instantaneous environmental and battery state conditions and calculation of the corrected second factor from the instantaneous second factor and from at least one weighted previously determined second factor. The instantaneously determined first and second factors are thus not transferred directly. In fact, a weighted influence from previously determined factors is retained.

According to an exemplary embodiment, the first factor for the reference temperature $T_0$ is preferably calculated using the formula $$Rfact_{Met}(T_0) = \frac{R_1 \cdot f(T_1, SOC_1) - R_2 \cdot f(T_2, SOC_2)}{r(T_1) \cdot f(T_1, SOC_1) - r(T_2) \cdot f(T_2, SOC_2)}$$

where $R_1$ is the internal resistance, $T_1$ is the battery or environmental temperature, and $SOC_1$ is the state of charge parameter at the time of a first measurement for the first environmental and battery state conditions, and $R_2$ is the internal resistance, $T_2$ is the battery or environmental temperature, and $SOC_2$ is the state of charge parameter at the time of a second measurement for the second environmental and battery state conditions.

The second factor is preferably calculated using the formula $$Lfact=1/([R_{i-RfactMet}(T_0)\cdot r(T_i)]\cdot f(T_i,SOC_i)),$$

where $R_i$ is the internal resistance, $T_i$ is the battery or environmental temperature, and $SOC_i$ is the state of charge parameter at the time i of a measurement.

It is particularly advantageous not only to subdivide the internal resistance into the first and second resistance components but also into a third resistance component for the region of the positive active mass of the energy storage battery and/or into a fourth resistance component for the region of the negative active mass of the energy storage battery, and to determine the third and/or fourth resistance components using the method as described above, in each case using an associated factor and an associated function, as a function of parameters for the environmental and battery state conditions.

The predicted internal resistance is preferably used to make a prediction about the state of the energy storage battery, for example the wear, the performance or the functionality of the energy storage battery.

FIG. 1 is a diagram relating to the subdivision of the internal resistance $R_i$ of an energy storage battery into a first resistance component $R_{Met}$ and a second resistance component $R_{Elyt}$. The first resistance component $R_{Met}$ represents the electrical resistance of the energy storage battery for the region of electron conduction. This first resistance component is composed of the metallic resistances of an energy storage battery, in particular of the terminal bolts, terminal links, terminal connectors and lead grating in a lead-acid rechargeable battery. The second resistance component represents the electrical resistance of the energy storage battery for the region of ion conduction, that is to say the resistance contribution to the electrolyte paths, in particular the space between the electrodes and the electrode pores that are filled with electrolyte.

In the case of lead-acid rechargeable batteries, further contributions to the electrical resistance of the first resistance component can be ignored, in particular the resistance contributions from the positive and negative active materials. These resistance components may, however, also be taken into account as further additive resistance components, corresponding to the first and second resistance components, when determining the internal resistance.

The method according to an exemplary embodiment will be explained in the following text using the example of a lead-acid rechargeable battery. However, the method is not restricted to lead-acid rechargeable batteries, but can also be applied in a corresponding manner to other types of rechargeable batteries.

The internal resistance $R_i$ is calculated as:

$$R_i=R_{Met}+R_{Elyt}.$$

The first resistance component $R_{Met}$ is preferably calculated from a factor $Rfact_{Met}$ and from a battery-independent first function $r(T)$ of parameters of the environmental conditions for the energy storage battery using the formula:

$$R_{Met}=Rfact_{Met}(T_0)\cdot r(T)$$

where $T_0$ is a reference temperature and T is the environmental or battery temperature.

The second resistance component $R_{Elyt}$ is determined from a second factor Lfact and from a battery-independent second function f(T,SOC) of the environmental and battery state conditions for the energy storage battery using the formula $$R_{Elyt}=l/(Lfact \cdot f(T,SOC))$$

with SOC being a state of charge parameter which describes the state of charge of the energy storage battery. The state of charge SOC is the difference between the rated capacitance of the energy storage battery and the amount of charge drawn from it with respect to the rated capacity. In the case of a lead-acid rechargeable battery, there is a unique and largely linear relationship between the no-load voltage $U_{00}$ and the state of charge SOC, since the no-load voltage $U_{00}$ depends on the electrolyte concentration, which in turn depends on the state of charge. The no-load voltage $U_{00}$ can thus be chosen as an equivalent parameter, instead of the state of charge itself, as the state of charge parameter. This has the advantage that the no-load voltage $U_{00}$ can be measured relatively easily.

As can be seen from the formulae mentioned above, the first resistance component $R_{Met}$ does not depend on the state of charge parameter SOC but only on the temperature T. The second resistance component $R_{Elyt}$, on the other hand, depends on the acid concentration and thus also uniquely on the no-load voltage $U_{00}$ of the energy storage battery as a measure of the electrolyte concentration and of the state of charge of the energy storage battery. The second resistance component $R_{Elyt}$ also depends to a relatively major extent on the temperature T.

Figure 2:
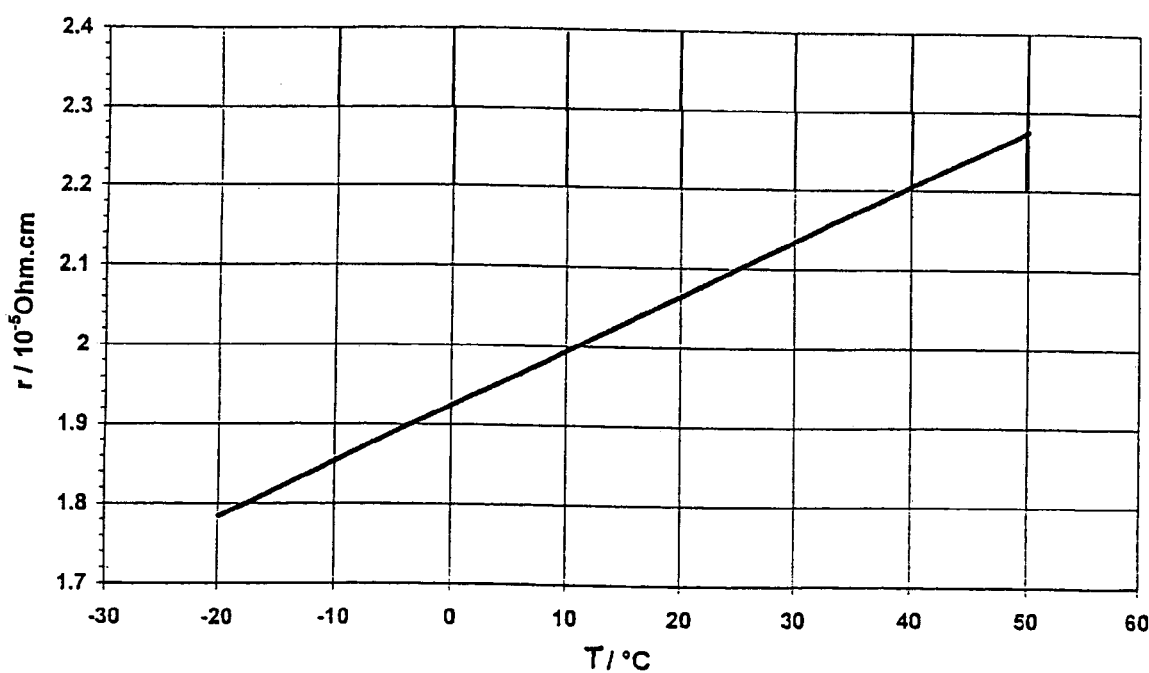
FIG. 2 shows a graph illustrating the specific resistance of lead as a function of temperature as a first function for determining the first resistance component.

By way of example, FIG. 2 shows a diagram or graph illustrating the specific resistance r of lead as a function of the temperature T. As can be seen, there is a linear relationship between the specific resistance of lead and the temperature T. Since the first resistance component $R_{Met}$ is determined essentially by the resistances of the metallic lead output conductors from the lead-acid battery, the first function r(T) for calculation of the first resistance component $R_{Met}$ can be derived directly from the temperature-dependent specific resistance r. This function of the specific resistance r, as a function of the temperature, can also be used directly as the first function. The first resistance component $R_{Met}$ is then calculated from the quotient of this first function r(T) and a first battery-dependent factor which, in particular, reflects the cross-sectional area of the lead.

Figure 3:
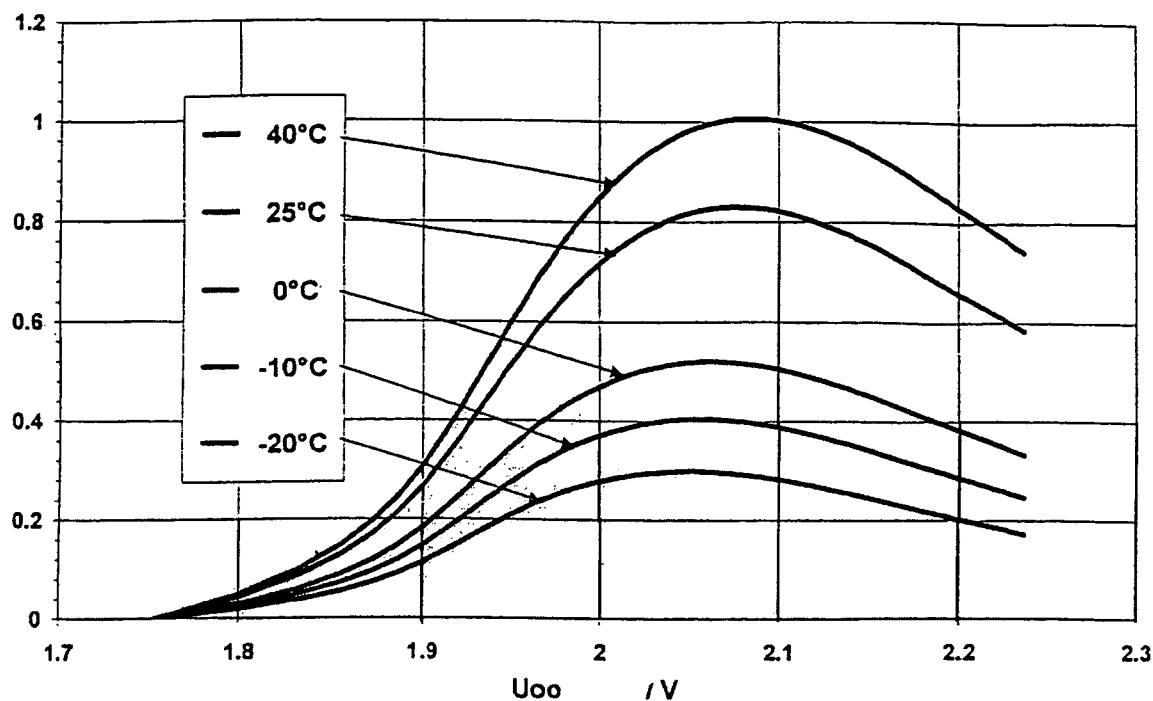
FIG. 3 shows a graph illustrating the specific conductivity of sulfuric acid as a function of the no-load voltage which results for various acid concentrations in a single cell as a basic family of functions for determination of the second function in order to establish the second resistance component.

FIG. 3 shows the specific conductivity g of sulfuric acid as a function of the no-load voltage $U_{00}$ that is produced for various acid concentrations in an individual cell at temperatures T in the range from 20° C. to 40° C. The second resistance component $R_{Elyt}$ is governed essentially by this sulfuric acid conductivity, which is dependent on the temperature and on the acid concentration.

Figure 4:
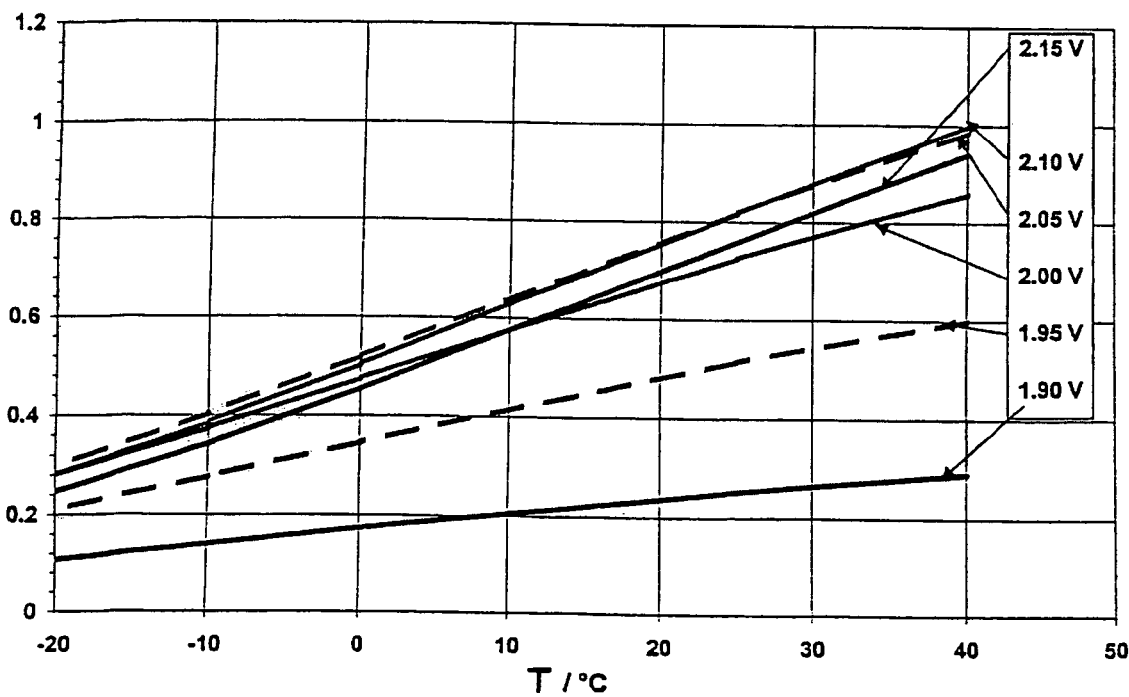
FIG. 4 shows a graph illustrating the specific conductivity of sulfuric acid as a function of the temperature for no-load voltages which occur with different acid concentrations, as an inverse second function for determination of the second resistance component.

FIG. 4 is a diagram or graph illustrating the specific conductivity g, derived from FIG. 3, of sulfuric acid as a function of the temperature T for various no-load voltages $U_{00}$ in an individual cell in the range from 1.9 to 2.15 V, as are produced for various acid concentrations. This clearly shows that the temperature-dependent specific conductivity g for the various no-load voltages $U_{00}$ can in each case be represented approximately as linear functions.

There is thus a relatively simple and unique relationship between the specific conductivity g and the temperature T, as well as the no-load voltage $U_{00}$, which describes the second function f(T,SOC) for determination of the second resistance component as a function of the parameters temperature T and state of charge SOC, and/or no-load voltage $U_{00}$. The second resistance component $R_{Elyt}$ is in this case calculated from a battery-dependent second factor Lfact and from this second battery-independent function f(T,SOC).

For a six-cell lead-acid rechargeable battery, the following approximations have been found for the first function r(T[° C.]) and f(t[° C.], $U_{00}$ [V]):

$$r(T[° C.])=(l+0.00334 \cdot (T-25)] \text{ and}$$

$$f(T[° C.])U_{00}[V]=(1.2487 \cdot (U_{00}-11.175)-0.4664 \cdot (U_{00}-11.175)^2) \cdot (l+0.0137 \cdot (T-25)),$$

with the temperature $T_0=25°$ C. having been chosen as the reference point for the temperature relationships.

The first factor $Rfact_{Met}$ and the second factor Lfact are parameters which characterize the energy storage battery. These values may either be specified by the battery manufacturer or may be learned during battery operation. Learning the first and second factors has the advantage that no prior knowledge is required about the battery type, the battery size, and the battery manufacturer.

These first and second factors $Rfact_{Met}$ and Lfact and the equation $$R_i=Rfact_{Met}(T_0) \cdot r(T)+l/(Lfact \cdot f(T,SOC/U_{00}))$$

can now be used to directly predict the internal resistance R for any given temperatures T and state of charge parameters SOC with the aid of the first and second functions r(T) and f(T,SOC). This has the advantage that the first and second functions r(T) and f(T,SOC) are relatively simple, unique, and, in particular, independent of the battery.

A method for determination of the first factor $Rfact_{Met}$ and of the second factor Lfact will be explained in the following text.

The internal resistance $R_1$, the battery or environmental temperature $T_1$ and the no-load voltage $U_{001}$ are measured in a first step. A value is then estimated for the first factor $Rfact_{Met}(T_0)$. The equation $$Lfact=l/([R_1-Rfact_{Met}(T_0) \cdot r(T)] \cdot f(T,U_{00})) \quad (1)$$

which is obtained from the equations described above is then used to calculate the second factor Lfact.

The estimated first factor $Rfact_{Met}$ for the reference temperature $T_0$ and the calculated second factor Lfact can now be used to make a first, still relatively inaccurate, prognosis of the future battery behavior in different environmental and/or battery state conditions.

In a next step, the internal resistance $R_2$, the battery or environmental temperature $T_2$ and the no-load voltage $U_{002}$ are measured again with changed environmental and/or battery state conditions, for example with a different environmental or battery temperature T.

The following equation $$Rfact_{Met}(T_0) = \frac{R_1 \cdot f(T_1, U_{001}) - R_2 \cdot f(T_2, U_{002})}{r(T_1) \cdot f(T_1, U_{001}) - r(T_2) \cdot f(T_2, U_{002})} \quad (2)$$

is then used together with the two measurements that have been carried out to calculate an improved value of the first factor $Rfact_{Met}(T_0)$.

The associated second factor Lfact is then calculated using the equation (1) as mentioned above and the newly calculated first factor $Rfact_{Met}(T_0)$.

In order to improve the accuracy, the measurements and the substitution of the measurement results into equations (2) and (1) can be repeated as often as desired.

The first and second factors $Rfact_{Met}$ and Lfact which characterize the energy storage battery can in this way be determined in a relatively simple manner, allowing quite accurate prediction of the internal resistance $R_i$ in different environmental and battery states.

One feature for this iterative determination of the first and second factors $Rfact_{Met}$ and Lfact is that the environmental and/or battery state conditions, such as the battery or environmental temperature T or state of charge, differ significantly from one another in the various measurements.

In order to take account of aging effects, the determination of the first and second factors $Rfact_{Met}$ and Lfact should, for example, be repeated at intervals.

Since uncertainties must always be assumed, for example, relating to the measurement accuracy of the test equipment, and scatter must therefore be taken into account, the determined first and second factors $Rfact_{Met}$ and Lfact should not be transferred directly. In fact, it is advantageous for the instantaneously determined factor to be correlated after having been weighted with a previously determined factor. For example, the first factor can be calculated using the equation $$Rfact_{Met}(T_0) = Rfact_{Met1}(T_0) + (Rfact_{Met0}(T_0) - Rfact_{Met1}(T_0)) \cdot WEIGHT$$

and the second factor can be calculated using the formula $$Lfact = (Lfact_1 + (Lfact_0 - Lfact_1)) \cdot WEIGHT$$

with the index 1 denoting the factor determined from the instantaneous measurement and the index 0 denoting a factor determined from a previous measurement. The weighting factor WEIGHT should be chosen as a value between 0 and 1, depending on the reliability of the resistance determination. For example, the weighting factor should be chosen to be higher the less the measurement inaccuracy with respect to the battery voltage and the battery current i. For example, in the case of a current/time profile i(T), if a large number of associated value pairs Ui and Ii have been determined and it has been possible to calculate numerous internal resistance values $R_K$ from them, then a higher weighting factor can be associated with the factor $Rfact_{Met}(T_0)$ obtained from this than if the determination process were based on a single value pair for the voltage/current change. The weighting can likewise be chosen, for example, to be higher the greater extent that the temperature T or the state of charge parameters SOC differ from one another at the time of the measurements of the internal resistance $R_i$. An analogous situation applies to the second factor Lfact.

In this way, it is possible to learn the relationship between the internal resistance $R_i$ of the energy storage battery and the state of charge for the temperature, even if the size and type of energy storage battery are not known. This is particularly advantageous in systems in which it is possible for the energy storage battery to be replaced by another energy storage battery which is not physically the same, or to be replaced by untrained personnel, for example, in a motor vehicle.

The method for learning the first and second factors also makes it possible to identify aging effects in the energy storage battery, for example, when the first and second factors $Rfact_{Met}$ and Lfact are determined in a first operating period, in order to characterize the energy storage battery. If it is then found in a second operating period that the first and second factors $Rfact_{Met}$ and Lfact remain approximately constant while, in a third period, it is found that the first and second factors $Rfact_{Met}$ and Lfact change, in particular systematically, then it is possible to deduce that ageing has occurred.

The method for prediction of the internal resistance $R_i$ can be associated with other methods which predict the operating behavior of the energy storage batteries in other states of charge SOC and/or at other temperatures T. For example, when using an electrical equivalent circuit which contains a pure resistive component, the predicted internal resistance $R_i$ for assumed environmental and/or battery state conditions can be inserted into the equivalent circuit. It is then possible, for example, to use the equivalent circuit to predict the voltage response of the energy storage battery.

In addition to the first resistance component $R_{Met}$ and the second resistance component $R_{Elyt}$, further resistance components may also occur, although these are generally negligible in the case of a battery. By way of example, a third resistance component may be the electrical resistance of the energy storage battery for the region of the positive active masses, and a fourth resistance component may be the electrical resistance of the energy storage battery for the region of the negative active masses. These further resistance components generally likewise have their own characteristic dependence on the battery or environmental temperature and on the state of charge SOC of the energy storage battery. The third and fourth resistance components are significant in particular for lithium-ion batteries, and should thus be determined in a corresponding manner by means of a battery-dependent factor and a battery-independent function. In this case, the functional relationship between the associated factor and the environmental and battery state parameters is formulated, and the parameters are determined successively using assumed initial values and a minimum number of mutually independent measurements.

According to another exemplary embodiment, a monitoring device is provided for energy storage batteries that includes measurement means for measurement of parameters for the environmental and operating state conditions for the energy storage battery, and having computation means which are designed to carry out the method described above. The computation means may, for example, be in the form of a processor device with computer programs running on the processor device. The measurement means are preferably provided for measurement of the battery or environmental temperature, for determination of the internal resistance, and for measurement of the no-load voltage.

According to another exemplary embodiment, a product in the form of an embodied computer program is provided with program code means which are designed to carry out the method described above when the computer program is run using a processor device. The parameters for the environmental and battery state conditions, in particular the temperature, the measurement variables for determination of the state of charge parameters and the internal resistance are detected by the computer program, via suitable interfaces.

It is important to note that the method and systems described in the preferred and other exemplary embodiments are illustrative only. Although only a few embodiments of the present inventions have been described in detail in this disclosure, those skilled in the art who review this disclosure will readily appreciate that many modifications are possible (e.g., variations in values of parameters, etc.) without materially departing from the novel teachings and advantages of the subject matter recited herein. Other substitutions, modifications, changes and omissions may be made in the design, operating conditions and arrangement of the preferred and other exemplary embodiments without departing from the scope of the present inventions.

What is claimed is:

1. A method for predicting the internal resistance of an energy storage battery in assumed environmental and battery state conditions, the method comprising:
   subdividing the internal resistance into a first resistance component which represents the electrical resistance of the energy storage battery for the region of electron conduction and a second resistance component which represents the electrical resistance of the energy storage battery for the region of ion conduction;
   determining a first factor for the first resistance component and a second factor for the second resistance component as a function of the type of energy storage battery, wherein the first and second factors are determined by determining parameters and internal resistances for at least two conditions which differ from one another, wherein the at least two conditions are selected from environmental and battery state conditions; and
   determining the first and second resistance components to be expected for the assumed environmental and battery state conditions, wherein the first resistance component is determined from the first factor and from a battery-independent first function of parameters relating to the environmental conditions for the energy storage battery and the second resistance component is determined from the second factor and from a battery-independent second function relating to the environmental and battery state conditions for the energy storage battery.

2. The method of claim 1 further comprising:
   utilizing a variable which is dependent on battery temperature as a parameter for determining the first resistance component; and
   utilizing a variable which is dependent on battery temperature and on the state of charge of the energy storage battery as a parameter for determining the second resistance component.

3. The method of claim 2 further comprising:
   determining at least one of the battery temperature and the environmental temperature as a temperature parameter;
   determining the no-load voltage of the energy storage battery as a state of charge parameter; and
   determining the internal resistance of the energy storage battery.

4. The method of claim 1 further comprising:
   a) estimating the first factor;
   b) determining the second factor as a function of the estimated first factor and of parameters which have been determined for first environmental and battery state conditions;
   c) determining a corrected first factor for second environmental conditions and battery state conditions as a function of the previously determined second factor and of the parameters determined for the second environmental and battery state conditions; and
   d) determining the second factor as a function of the corrected first factor and of the parameters determined for at least one of the first environmental conditions, the second environmental conditions, and the battery state conditions.

5. The method of claim 4 further comprising repeating steps c) and d).

6. The method of claim 1 wherein determining the first resistance component utilizes the formula $$R_{Met} = RFact_{Met}(T_0) \cdot r(T)$$

where $R_{Met}$ is the first resistance component, $RFact_{Met}(T_0)$ is the first factor for a reference temperature $T_0$ and $r(T)$ is a first function which is dependent on battery temperature T.

7. The method of claim 6 wherein the first function is defined by the equation $$r(T) = 1 + k \cdot (T-T_0) + 1(T-T_0)^2$$

where k and l are constants.

8. The method of claim 7 wherein determining the second resistance component utilizes the formula $$R_{Elyt} = \frac{1}{Lfact \cdot f(T, SOC)}$$

where $R_{Elyt}$ is the second resistance component, LFact is the second factor and $f(T, SOC)$ is a second function which is dependent on the battery temperature T and on the state of charge SOC for the energy storage battery.

9. The method of claim 8 wherein the second function is defined by the equation $$f(T,SOC) = (a + b \cdot SOC + c \cdot SOC^2) \cdot (1 + d(T-T_0) + e(T-T_0)^2)$$

where a, b, c, d and e are constants and $T_0$ is a reference temperature.

10. The method of claim 1 further comprising:
    determining an instantaneous first factor for instantaneous environmental and battery state conditions; and
    calculating a corrected first factor from the instantaneous first factor and from at least one weighted previously determined first factor.

11. The method of claim 10 further comprising:
    determining an instantaneous second factor for instantaneous environmental and battery state conditions; and
    calculating a corrected second factor from the instantaneous second factor and from a weighted previously determined second factor.

12. The method of claim 11 further comprising:
    calculating the first factor for the reference temperature utilizing the formula $$Rfact_{Met}(T_0) = \frac{R_1 \cdot f(T_1, U_{001}) - R_2 \cdot f(T_2, U_{002})}{r(T_1) \cdot f(T_1, U_{001}) - r(T_2) \cdot f(T_2, U_{002})}$$

where $Rfact_{Met}(T_0)$ is the first factor, $T_0$ is the reference temperature, $R_1$ is the internal resistance, $T_1$ is one of the battery temperature and the environmental temperature, $SOC_1$ is the state of charge parameter at the time of a first measurement for the first environmental and battery state conditions and where $R_2$ is the internal resistance, $T_2$ is the battery or environmental temperature, and $SOC_2$ is the state of charge parameter at the time of a second measurement for the second environmental and battery state conditions.

13. The method of claim 12 further comprising:
    calculating the second factor using the formula $$Lfact = 1/[(R_i - Rfact_{Met}(T_0)] \cdot f(T_i, SOC_i)$$

where Lfact is the second factor, $R_i$ is the internal resistance, $T_i$ is one of the battery temperature and the environmental temperature, and $SOC_i$ is the state of charge parameter at the time of a measurement i.

14. The method of claim 1 further comprising:
subdividing the internal resistance into a third resistance component for the region of the positive active mass of the energy storage battery and into a fourth resistance component for the region of the negative active mass of the energy storage battery; and
determining the third and fourth resistance components in using an associated factor and a function of parameters for environmental and battery state conditions.

15. The method of claim 1 further comprising predicting the state of the energy storage battery as a function of predicted internal resistance.

16. The method of claim 15 further comprising predicting at least one of the wear, the performance, and the functionality of the energy storage battery.

17. A monitoring device for an energy storage battery comprising:
a measurement device for measuring parameters for the environmental and operating state conditions of the energy storage battery; and
a computation device configured to carry out a method comprising:
subdividing the internal resistance of the energy storage battery into a first resistance component which represents the electrical resistance of the energy storage battery for the region of electron conduction and a second resistance component which represents the electrical resistance of the energy storage battery for the region of ion conduction;
determining a first factor for the first resistance component and a second factor for the second resistance component as a function of the type of energy storage battery, wherein the first and second factors are determined by determining parameters and internal resistances for at least two conditions which differ from one another, wherein the at least two conditions are selected from environmental and battery state conditions; and
determining the first and second resistance components to be expected for the assumed environmental and battery state conditions, wherein the first resistance component is determined from the first factor and from a battery-independent first function of parameters relating to the environmental conditions for the energy storage battery and the second resistance component is determined from the second factor and from a battery-independent second function relating to the environmental and battery state conditions for the energy storage battery.

18. The monitoring device of 17 wherein the measurement means are provided for measurement of at least one of the battery temperature and the environmental temperature, for determination of the internal resistance of the energy storage battery, and for measurement of the no-load voltage of the energy storage battery.

19. A computer program comprising:
computer program code that when run using a processor device is configured to carry out a method comprising:
subdividing the internal resistance of the energy storage battery into a first resistance component which represents the electrical resistance of the energy storage battery for the region of electron conduction and a second resistance component which represents the electrical resistance of the energy storage battery for the region of ion conduction;
determining a first factor for the first resistance component and a second factor for the second resistance component as a function of the type of energy storage battery, wherein the first and second factors are determined by determining parameters and internal resistances for at least two conditions which differ from one another, wherein the at least two conditions are selected from environmental and battery state conditions; and
determining the first and second resistance components to be expected for the assumed environmental and battery state conditions, wherein the first resistance component is determined from the first factor and from a battery-independent first function of parameters relating to the environmental conditions for the energy storage battery and the second resistance component is determined from the second factor and from a battery-independent second function relating to the environmental and battery state conditions for the energy storage battery.

20. The computer program of claim 19 wherein the computer program code comprises a program file which is stored on a data storage medium.

21. The computer program of claim 19 wherein the computer program code comprises a program data stream that is transmitted in a data network.

* * * * *

UNITED STATES PATENT AND TRADEMARK OFFICE
CERTIFICATE OF CORRECTION

PATENT NO.       : 7,098,665 B2
APPLICATION NO.  : 10/705033
DATED            : August 29, 2006
INVENTOR(S)      : Helmut Laig-Hoerstebrock It is certified that error appears in the above-identified patent and that said Letters Patent is hereby corrected as shown below:

Column 12:
  line 7: Replace the formula with -- $r(T) = 1 + k \cdot (T-T_0) + l(T-T_0)^2$ --.

line 15: Replace the formula with -- $R_{Elyt} = \dfrac{1}{Lfact \cdot f(T, SOC)}$ --.

lines 24 and 25: Replace the formula with
  -- $f(T, SOC) = (a + b \cdot SOC + c \cdot SOC^2) \cdot (1 + d(T-T_0) + e(T-T_0)^2)$ --.

line 62: Replace the formula with
  -- $Lfact = \dfrac{1}{[R_i - Rfact_{Mei}(T_O) \cdot r(T_i)] \cdot f(T_i, SOC_i)}$ --.

Signed and Sealed this

Twenty-fourth Day of April, 2007

JON W. DUDAS
*Director of the United States Patent and Trademark Office*